(12) United States Patent
Zhou

(10) Patent No.: US 12,229,410 B2
(45) Date of Patent: Feb. 18, 2025

(54) SOLID STATE DRIVE MANAGEMENT METHOD AND SOLID STATE DRIVE

(71) Applicant: HUAWEI TECHNOLOGIES CO., LTD., Guangdong (CN)

(72) Inventor: Jianhua Zhou, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 109 days.

(21) Appl. No.: 17/933,857

(22) Filed: Sep. 21, 2022

(65) Prior Publication Data

US 2023/0013322 A1 Jan. 19, 2023

Related U.S. Application Data

(63) Continuation of application No. PCT/CN2021/078761, filed on Mar. 2, 2021.

(30) Foreign Application Priority Data

Mar. 30, 2020 (CN) .......................... 202010239685.0
Jul. 1, 2020 (CN) .......................... 202010621839.2

(51) Int. Cl.
G06F 3/06 (2006.01)
(52) U.S. Cl.
CPC .......... *G06F 3/0616* (2013.01); *G06F 3/0653* (2013.01); *G06F 3/0679* (2013.01)
(58) Field of Classification Search
CPC .... G06F 3/0616; G06F 3/0653; G06F 3/0679; G06F 2212/1036; G06F 2212/7201; G06F 2212/7204; G06F 2212/7205; G06F 2212/7206; G06F 2212/7208; G06F 3/0634; G06F 3/0644; G06F 12/0246; G06F 3/0619; G11C 11/5628; G11C 16/08; G11C 16/10; G11C 16/349
See application file for complete search history.

(56) References Cited

U.S. PATENT DOCUMENTS 10,860,511 B1 * 12/2020 Thompson .............. G06F 13/28
2012/0240012 A1 * 9/2012 Weathers ............... G11C 29/52
714/E11.034
(Continued)

FOREIGN PATENT DOCUMENTS

CN 102473140 A 5/2012
CN 107506137 A 12/2017
(Continued)

OTHER PUBLICATIONS

Yang Tianming et al: "GD-FTL: Improving the Performance and Lifetime of TLC SSD by Downgrading Worn-out Blocks", XP033548789, 2018, Total 8 Pages.
(Continued)

*Primary Examiner* — Zhuo H Li

(57) ABSTRACT

A solid state drive management solution is provided, and includes: detecting that a usage status of a first storage space of an SSD meets a preset condition, where the first storage space works in a first mode; and enabling, based on the detection result, the first storage space to work in a second mode to obtain a second storage space, where a quantity of bits that can be stored in a cell in the first storage space is greater than a quantity of bits that can be stored in a cell in the second storage space.

25 Claims, 6 Drawing Sheets

(56) References Cited

U.S. PATENT DOCUMENTS

| | | | |
|---|---|---|---|
| 2014/0149473 A1 | 5/2014 | Kim et al. | |
| 2015/0363105 A1 | 12/2015 | Nakao et al. | |
| 2017/0177258 A1* | 6/2017 | Bates | G06F 3/0634 |
| 2019/0095116 A1* | 3/2019 | Igahara | G06F 3/0604 |
| 2019/0294358 A1 | 9/2019 | Suzuki et al. | |
| 2020/0401514 A1* | 12/2020 | Liang | G11C 11/1659 |
| 2021/0064495 A1* | 3/2021 | Huang | G11C 16/14 |

FOREIGN PATENT DOCUMENTS

| | | |
|---|---|---|
| CN | 109491592 A | 3/2019 |
| CN | 110399094 A | 11/2019 |

OTHER PUBLICATIONS

Bjorling Matias: "From Open-Channel SSDs to Zoned Namespaces", XP055815314, Jan. 23, 2019, total 18 pages.

* cited by examiner

| First storage space (QLC) | | Second storage space (TLC) | | Third storage space (MLC) | | Fourth storage space (SLC) | |
|---|---|---|---|---|---|---|---|
| Capacity | Program/erase cycles | Capacity | Program/erase cycles | Capacity | Program/erase cycles | Capacity | Program/erase cycles |
| 1 TB | 300 | 768 GB | 1000 | 512 GB | 3000 | 256 GB | 10000 |
| Promised capacity | Promised program/erase cycles | Additional capacity | Additional program/erase cycles | Additional capacity | Additional program/erase cycles | Additional capacity | Additional program/erase cycles |

FIG. 7

SOLID STATE DRIVE MANAGEMENT METHOD AND SOLID STATE DRIVE

CROSS-REFERENCE TO RELATED APPLICATIONS

This application is a continuation of International Application No. PCT/CN2021/078761, filed on Mar. 2, 2021, which claims priority to Chinese Patent Application No. 202010239685.0, filed on Mar. 30, 2020, and Chinese Patent Application No. 202010621839.2, filed on Jul. 1, 2020. All of the aforementioned patent applications are hereby incorporated by reference in their entirety.

TECHNICAL FIELD

This disclosure relates to the field of storage technologies, and in particular, to a solid state drive management method and a solid state drive.

BACKGROUND

A solid state drive is usually implemented by using a NAND flash. The NAND flash is a non-volatile random access storage medium, and is characterized by losing no data after the NAND flash is powered off. The NAND flash is different from a conventional volatile random access storage medium and a volatile memory such as a DRAM and an SRAM, and therefore, may be used as a persistent memory.

A unit capacity of the SSD is determined by a quantity of bits that can be stored in a single cell. With development of the NAND flash, the cell has developed to a quad-level cell (QLC). However, as a cell capacity of the NAND flash continuously increases, the lifespan of the NAND flash continuously shortens. Usually, an SSD whose predetermined lifespan has expired cannot be used.

SUMMARY

This application provides a solid state drive management method and a solid state drive SSD to prolong a lifespan of the solid state drive SSD, and further provide an additional storage capacity.

According to a first aspect, the present disclosure provides a solid state drive management method that includes:
  detecting that a usage status of a first storage space of an SSD meets a preset condition, where the first storage space works in a first mode; and
  enabling, based on the detection result, the first storage space to work in a second mode to obtain a second storage space, where a quantity of bits that can be stored in a cell in the first storage space is greater than a quantity of bits that can be stored in a cell in the second storage space. The lifespan of a cell with a larger capacity is shorter than the lifespan of a cell with a smaller capacity, but the cell with a larger capacity may be used as a cell with a smaller capacity. In the present disclosure, different modes correspond to different cell capacities. A cell capacity is a quantity of bits that can be stored in a cell. When the usage status of the first storage space of the SSD meets the preset condition, the first storage space of the SSD is enabled to work in the second mode. A cell capacity corresponding to the second mode is less than a cell capacity corresponding to the first mode. As a cell capacity decreases, a storage space also decreases. Therefore, corresponding to the first storage space working in the first mode, the second storage space is obtained after the first storage space works in the second mode. That is, the second mode corresponds to the second storage space. As the cell capacity decreases, the lifespan of the storage space increases to prolong the lifespan of the SSD. In addition, before the usage status of the first storage space meets the preset condition, the first storage space may provide a capacity in the first mode, and the first storage space is enabled to work in the second mode to obtain the second storage space. While the lifespan is prolonged, the additional second storage space can be further provided. Therefore, while the lifespan is prolonged, an additional storage capacity can be further provided.

The first storage space working in the first mode related to that a quantity of bits that can be stored in cells in the first storage space, that is, the first storage space, stores data by using a cell of a first type. The second storage space working in the second mode related to that a quantity of bits that can be stored in cells in the second storage space, that is, the second storage space, stores data by using a cell of a second type. The mode in embodiments of the present invention corresponds to a cell type. When a storage space works in a specific mode, the storage space stores data by using a cell of a specific type. The storage space stores data by using a cell of a specific type, and a physical structure of a cell is not required to be a cell of this type. For example, when the storage space works in a multi-level cell (MLC), that is, when the storage space stores data by using a cell of an MLC type, a physical structure of a cell in the storage space may be a QLC or a triple level cell (TLC). When a physical structure of a cell in the storage space is a QLC and the storage space stores data by using a cell of an MLC type, only 2 lower bits of the QLC may be used to provide a data storage service. When a physical structure of a cell in the storage space is a TLC and the storage space stores data by using a cell of an MLC type, only 2 lower bits of the TLC may be used to provide a data storage service.

In an implementation, the usage status is one of program and/or erase cycles (written "program/erase cycles" for simplicity), terabytes written, or an amount of written data. The program/erase cycles, the terabytes written, or the amount of written data determines a degree of wear of the SSD and reflects a usage status of the SSD.

In an implementation, the enabling the first storage space to work in a second mode includes: using n lower bits in a quantity of bits that can be stored in a floating gate transistor in the first mode as a quantity n of bits that can be stored in the floating gate transistor in the second mode, where n is an integer greater than 0. During specific implementation, according to a current technology, n may be 1, 2, or 3. During specific implementation, the SSD enables, by using firmware, the first storage space originally working in the first mode to work in the second mode to obtain the second storage space, or this may be implemented by an SSD controller.

In an implementation, the first storage space is all storage spaces of the SSD. That is, all the storage spaces work in the first mode. Usage status of all the storage spaces of the SSD meet the preset condition, and the entire storage space of the SSD can be enabled to work in the second mode.

In another implementation, the first storage space is one of a plurality of storage spaces of the SSD.

In an implementation, the SSD is divided into a plurality of namespaces, and one storage space corresponding to one namespace is the first storage space.

In another implementation, the SSD includes one namespace, and a storage space corresponding to the namespace is the first storage space.

In an implementation, in the SSD that supports a zoned namespace (NS), one namespace is divided into a plurality of zones, and a storage space corresponding to one zone is the first storage space.

In an implementation, in a key-value (KV)-based SSD, a storage space that is corresponding to a key-value of the SSD and that can be used to continuously store data is used as the corresponding first storage space.

In an implementation, the method further includes, prior to enabling the first storage space to work in a second mode based on the detection result, backing up data in the first storage space. Before the first storage space is enabled to work in the second mode, the data in the first storage space is backed up to prevent a data loss. During a specific implementation, the data may be backed up to a cloud storage device or another storage device.

In another implementation, the method further includes, prior to enabling the first storage space to work in a second mode based on the detection result, backing up valid data in the first storage space. Before the first storage space is enabled to work in the second mode, the valid data in the first storage space is backed up. This prevents a data loss and reduces an amount of backup data. During specific implementation, the valid data may be backed up to a cloud storage device or another storage device.

In an implementation, the first mode is a quad-level cell QLC, and the second mode is at least one of a triple-level cell TLC, a multi-level cell MLC, and a single-level cell SLC.

In an implementation, the first mode is a triple-level cell TLC, and the second mode is at least one of a multi-level cell MLC and a single-level cell SLC.

In an implementation, the first mode is a multi-level cell MLC, and the second mode is a single-level cell SLC.

In an implementation, the usage status is update frequency of data stored in the first storage space. When the update frequency meets a preset condition, the first storage space is enabled to work in the second mode, to obtain the second storage space. The preset condition is a predetermined threshold. In another implementation, the usage status is a property of data stored in the first storage space. When the property of the stored data meets a preset condition, the first storage space is enabled to work in the second mode. The preset condition is metadata, parity data in erasure coding (EC), or parity data in a redundant array of independent disks (RAID). That is, the property of the data stored in the first storage space is the metadata, the parity data in the EC, or the parity data in the RAID, and update frequency of the metadata, the parity data in the EC, or the parity data in the RAID is high. The SSD includes a plurality of storage spaces, each storage space being provided to store data of one flow, and one of the storage spaces is the first storage space.

In an implementation, the usage status is an error rate of data stored in the first storage space. When the error rate of the data stored in the first storage space meets a preset condition, the first storage space is enabled to work in the second mode.

According to a second aspect, the present disclosure provides a solid state drive SSD. The solid state drive includes a solid state drive controller and a storage medium, and the solid state drive controller is configured to perform the solutions in the first aspect and the implementations of the first aspect of the present disclosure.

According to a third aspect, a solid state drive management apparatus includes a plurality of units configured to perform the solutions in the first aspect and the implementations of the first aspect.

According to a fourth aspect, a solid state drive controller includes a plurality of circuits configured to perform the solutions in the first aspect and the implementations of the first aspect.

According to a fifth aspect, a computer-readable storage medium includes program instructions, and a solid state drive controller of a solid state drive performs the solutions in the first aspect and the implementations of the first aspect of the present disclosure based on the program instructions.

According to a sixth aspect, a computer program product includes program instructions, and a solid state drive controller of a solid state drive performs the solutions in the first aspect and the implementations of the first aspect of the present disclosure based on the program instructions.

The detecting that a usage status of a first storage space of an SSD meets a preset condition in the first aspect of the present invention may also be performed by an electronic device that communicates with the SSD. The electronic device may be an array controller of a storage array, a storage node in distributed storage, a disk enclosure, a server, a notebook computer, or the like. Specifically, the electronic device may monitor the usage status of the first storage space of the SSD, or the SSD may report the usage status of the first storage space. The electronic device detects that the usage status of the first storage space of the SSD meets the preset condition. The first storage space works in a first mode. The electronic device sends, based on the detection result, an instruction to the SSD, to enable the first storage space to work in a second mode, to obtain a second storage space. A quantity of bits that can be stored in a cell in the first storage space is greater than a quantity of bits that can be stored in a cell in the second storage space. In an implementation, the instruction sent by the electronic device to the SSD may include information about the second mode, for example, a cell type. A specific value in the instruction may be used to represent the information about the second mode. In another implementation, the SSD stores mode translation information of the first storage space and the SSD sequentially performs mode translation based on an instruction sent by the electronic device. For example, the mode translation information includes a TLC, an MLC, and an SLC. Initially, the first storage space works in the TLC, and the electronic device sends an instruction for the first time to enable the first storage space to work in the MLC to obtain the second storage space. The electronic device sends an instruction again to enable the second storage space to work in the SLC to obtain a third storage space.

The SSD receives the instruction sent by the electronic device and enables, based on the instruction, the first storage space of the SSD working in the first mode to work in the second mode to obtain the second storage space. A quantity of bits that can be stored in a cell in the first storage space is greater than a quantity of bits that can be stored in a cell in the second storage space.

In an implementation, the usage status is program/erase cycles, terabytes written, or an amount of written data. The program/erase cycles, the terabytes written, or the amount of written data determines a degree of wear of the SSD and reflects a usage status of the SSD.

In an implementation, the enabling the first storage space to work in a second mode includes using n lower bits in a quantity of bits that can be stored in a floating gate transistor in the first mode as a quantity n of bits that can be stored in the floating gate transistor in the second mode, where n is an integer greater than 0. During specific implementation, according to a current technology, n may be 1, 2, or 3.

In an implementation, the first storage space is all storage spaces of the SSD. That is, all the storage spaces work in the first mode. Usage statuses of all the storage spaces of the SSD meet the preset condition, and the entire storage space of the SSD can be enabled to work in the second mode.

In another implementation, the first storage space is one of a plurality of storage spaces of the SSD.

In an implementation, the SSD is divided into a plurality of namespaces, and one storage space corresponding to one namespace is the first storage space.

In another implementation, the SSD includes one namespace, and a storage space corresponding to the namespace is the first storage space.

In an implementation, in the SSD that supports a zoned namespace (NS), one namespace is divided into a plurality of zones, and a storage space corresponding to one zone is the first storage space.

In an implementation, in a key-value (KV)-based SSD, a storage space that is corresponding to a key-value of the SSD and that can be used to continuously store data is used as the corresponding first storage space.

In an implementation, before the first storage space is enabled to work in the second mode based on the instruction, the electronic device or the SSD backs up data in the first storage space. Before the first storage space is enabled to work in the second mode, the data in the first storage space is backed up to prevent a data loss. During specific implementation, the data may be backed up to a cloud storage device or another storage device.

In another implementation, before the first storage space is enabled to work in the second mode based on the instruction, the electronic device or the SSD backs up valid data in the first storage space. Before the first storage space is enabled to work in the second mode, the valid data in the first storage space is backed up. This prevents a data loss and reduces an amount of backup data. The valid data may be backed up to a cloud storage device or another storage device.

In an implementation, the first mode is a quad-level cell QLC, and the second mode is at least one of a triple-level cell TLC, a multi-level cell MLC, and a single-level cell SLC.

In an implementation, the first mode is a triple-level cell TLC, and the second mode is at least one of a multi-level cell MLC and a single-level cell SLC.

In an implementation, the first mode is a multi-level cell MLC, and the second mode is a single-level cell SLC.

In an implementation, the usage status is update frequency of data stored in the first storage space. When the update frequency meets the preset condition, the first storage space is enabled to work in the second mode to obtain the second storage space. The preset condition is a predetermined threshold. In another implementation, the usage status is a property of data stored in the first storage space. When the property of the stored data meets a preset condition, the first storage space is enabled to work in the second mode. The preset condition is metadata, parity data in erasure coding (EC), or parity data in a redundant array of independent disks (RAID). That is, the property of the data stored in the first storage space is the metadata, the parity data in the EC, or the parity data in the RAID, and update frequency of the metadata, the parity data in the EC, or the parity data in the RAID is high. The SSD includes a plurality of storage spaces, each storage space being configured to store data of one flow, and one of the storage spaces is the first storage space.

According to the solutions performed by the electronic device. The electronic device includes a plurality of units, configured to perform the corresponding solutions.

The present disclosure provides another electronic device, including a processor and an interface. The processor communicates with the interface, and the processor is configured to perform the corresponding solutions.

The present disclosure provides a solid state drive management apparatus that includes a plurality of units configured to perform the corresponding solutions.

The present disclosure provides a solid state drive that includes a plurality of circuits configured to perform the corresponding solutions.

The present disclosure provides a computer-readable storage medium that includes program instructions, and a solid state drive controller of a solid state drive performs the corresponding solutions based on the program instructions.

The present disclosure provides a computer program product that includes program instructions, and a solid state drive controller of a solid state drive performs the corresponding solutions based on the program instructions.

BRIEF DESCRIPTION OF DRAWINGS

FIG. 1 is a schematic diagram of a structure of an SSD according to an;

FIG. 7 is a schematic diagram of modes, capacities, and program/erase cycles of an SSD according to an embodiment;

DESCRIPTION OF EMBODIMENTS

To make objectives, technical solutions, and advantages of this disclosure more clear, the following further description describes implementations in detail with reference to accompanying drawings.

Figure 1:
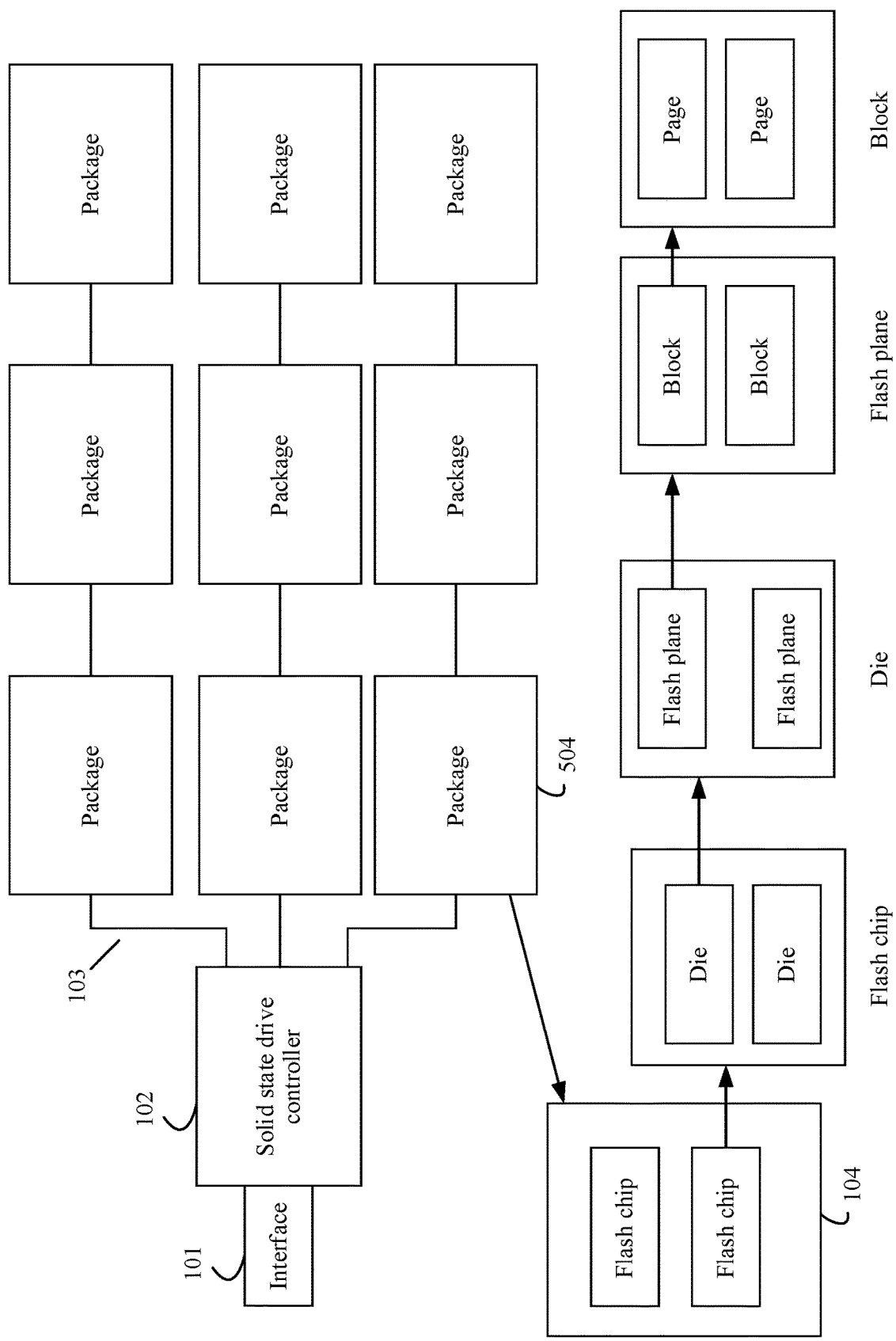

Usually, an SSD uses a page as a minimum read/write unit and uses a block as an erase unit. The SSD can implement parallelism of data access of a plurality of levels such as a channel, a die package, a flash chip, NAND flash, a die, and a flash plane. In the SSD, die packages in a flash are organized in a multi-channel manner, a plurality of die packages may be connected on each channel, and the plurality of die packages share a transmission channel but can independently execute instructions. FIG. 1 is a schematic diagram of a structure of an SSD according to an embodiment. The SSD includes an interface 101, a solid state drive controller 102, a channel 103, and a package 104. One package 104 includes a plurality of flash chips, each flash chip includes one or more dies, each die includes a plurality of flash planes, each flash plane includes a plurality of blocks, each block includes a plurality of pages, and each page includes a plurality of cells. A cell is a minimum storage unit of the SSD, and one cell may store 1 bit (bit) or more bits of data. The interface 101 may be an interface that supports the serial attached small computer system interface (SAS) protocol, the non-volatile memory express ( ) protocol, the peripheral component interconnect express (PCIe) protocol, or the like. The standard SSD interface 101 provides a block interface externally, that is, provides a logical block address (LBA). The solid state drive controller 102 maps the LBA to a physical address by using a flash translation layer (FTL). The SSD may further support another interface, for example, supports an open channel interface. This is not limited in embodiments of the present disclosure.

Figure 2:
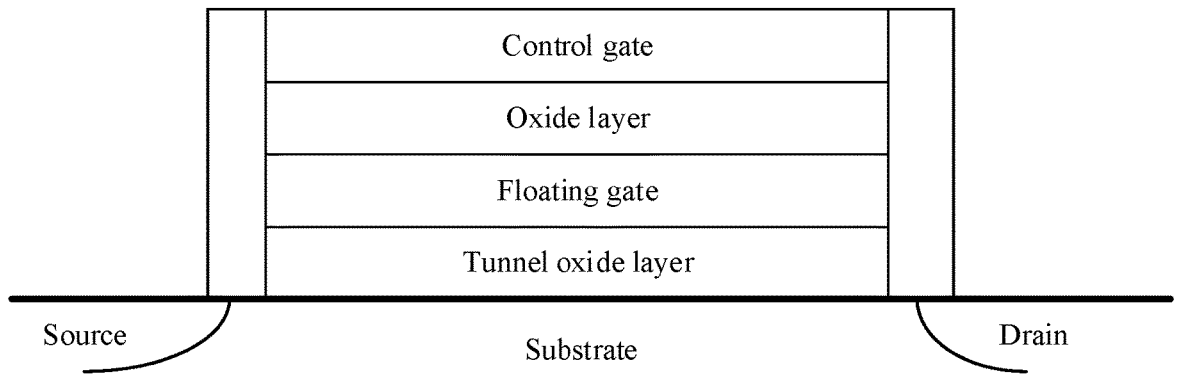
FIG. 2 is a schematic diagram of a structure of a floating gate transistor according to an embodiment.

A basic storage unit of the NAND flash in the SSD is a floating gate transistor, and one floating gate transistor corresponds to one cell. A structure of the floating gate transistor is shown in FIG. 2. The floating gate transistor includes a control gate, an oxide layer, a floating gate, and a tunnel oxide layer from top to bottom, and a source, a drain, and a substrate are at the bottom. The floating gate for storing an electron is formed on a transistor on which a current is unidirectionally conducted between the source and the drain The floating gate is surrounded by insulation layers up and down, making it easy for an electron to enter but difficult to exit, and an electron stored in the floating gate does not disappear due to a power failure. Therefore, a flash is a non-volatile memory. Data is written in/erased from the floating gate transistor by charging/discharging an electron to/from the floating gate. When data is to be written in the floating gate transistor, a positive voltage is applied to the control gate, so that an electron enters the floating gate through the insulation layer. In other words, a process of writing data is a charging process. When data is to be erased from the floating gate transistor, a positive voltage is applied to the substrate, so that an electron passes through the insulation layer of the floating gate to release the electron from the floating gate. The data is stored in 0 and 1 in binary, and 0 and 1 of the data may represent two states: a state in which there is an electron in the floating gate and a state in which there is no electron in the floating gate. In this way, the data can be stored. Usually, the state in which there is an electron is denoted as 0, and the state in which there is no electron is denoted as 1. Floating gate transistors in a same physical block are located on a same substrate. Therefore, when electrons are released from floating gates, all electrons on a same physical block are released. That is, when data is erased, data in the entire physical block is erased.

Currently, based on different quantities of bits that can be stored in cells, the cells may be classified into cells of the following types: a single-level cell (SLC), a multi-level cell (MLC), a triple-level cell (TLC), and a quad-level cell (QLC). A quantity of bits that can be stored in a cell is also referred to as a cell capacity. In the SLC, each cell can store 1-bit data. That is, in a floating gate transistor, 1-bit stored data is represented by using two states indicating whether there is one electron in the floating gate. Therefore, the 1-bit data that can be stored in the floating gate transistor corresponding to the SLC may be represented by 0 and 1. In the MLC, each cell can store 2-bit data. That is, in a floating gate transistor, 2-bit data is represented by using four states indicating whether there are a maximum of two electrons in the floating gate. Therefore, the 2-bit data that can be stored in the floating gate transistor corresponding to the MLC may be represented by 00, 01, 10, or 11. In the TLC, each cell can store 3-bit data. That is, in a floating gate transistor, 3-bit data is represented by using eight states indicating whether there are a maximum of three electrons in the floating gate. Therefore, the 3-bit data that can be stored in the floating gate transistor corresponding to the TLC may be represented by 000, 001, 010, 011, 100, 101, 110 and 111. In the QLC, each cell can store 4-bit data. That is, in a floating gate transistor, 4-bit data is represented by using 16 states indicating whether there are a maximum of four electrons in the floating gate.

As described above, when data is to be stored in the floating gate transistor, an electron needs to pass through the insulation layer of the floating gate and enter the floating gate. When data is erased from the floating gate transistor, an electron needs to pass through the insulation layer of the floating gate and be released from the floating gate. Usually, a thickness of the insulation layer of the floating gate layer is only 10 nanometers. Therefore, during data writing or erasing, each time an electron passes through the insulation layer of the floating gate, the insulation layer of the floating gate is worn down and becomes thinner. After the insulation layer is worn down and becomes thinner, an electron may be retained at the insulation layer. To complete data writing, a write voltage, that is, a programming voltage, needs to be increased. Consequently, time cost for data writing is prolonged, and finally performance is severely affected and the floating gate transistor cannot be used. In addition, in this case, when the write voltage is increased, more pressure is also imposed on the insulation layer, to accelerate wear-down. This problem also occurs when data is erased. Based on the foregoing principle, as data is written or erased, more electrons that can be stored in the floating gate of the floating gate transistor indicate a higher speed at which the insulation layer is worn down and becomes thinner or the insulation layer is broken down, resulting in a shorter lifespan. Usually, program/erase cycles supported by an SSD working in the QLC are 300, program/erase cycles supported by an SSD working in the TLC are 1000, program/erase cycles supported by an SSD working in the MLC are 3000, and program/erase cycles supported by an SSD working in the SLC are 10000. Therefore, due to data programming/erasing, lifespans of SSDs working in the SLC, the MLC, the TLC, and the QLC decrease as capacities of the cells sequentially increase. Therefore, program/erase cycles, terabytes written (TBW), an amount of written data, or the like may be used as a parameter for measuring a usage status of an SSD.

In embodiments of the present disclosure, the SSD enables, based on a usage status of a first storage space, the first storage space that originally works in a mode of a cell with a larger capacity to work in a mode of a cell with a smaller capacity, to obtain a second storage space. That is, the first storage space stores data by using a cell of a first type, and based on the usage status of the first storage space, the first storage space is enabled to store data by using a cell of a second type, to obtain the second storage space with a smaller capacity. This prolongs a lifespan of the SSD, and further provides the additional second storage space while prolonging the lifespan. In embodiments of the present invention, a cell capacity is represented by a quantity of bits that can be stored in a cell, for example, 1 bit, 2 bits, 3 bits, or 4 bits. A quantity of bits that can be stored in a cell is also referred to as a number of bits that can be stored in the cell.

The mode in embodiments of the present disclosure corresponds to a cell type. When a storage space works in a specific mode, the storage space stores data by using a cell of a specific type. In embodiments of the present invention, the storage space stores data by using a cell of a specific type, and a physical structure of a cell is not required to be a cell of this type. For example, when the storage space works in the MLC, that is, when the storage space stores data by using a cell of an MLC type, a physical structure of a cell in the storage space may be the QLC or the TLC. When a physical structure of a cell in the storage space is the QLC and the storage space stores data by using a cell of an MLC type, only 2 lower bits of the QLC may be used to provide a data storage service. When a physical structure of a cell in the storage space is the TLC and the storage space stores data by using a cell of an MLC type, only 2 lower bits of the TLC may be used to provide a data storage service.

Figure 3:
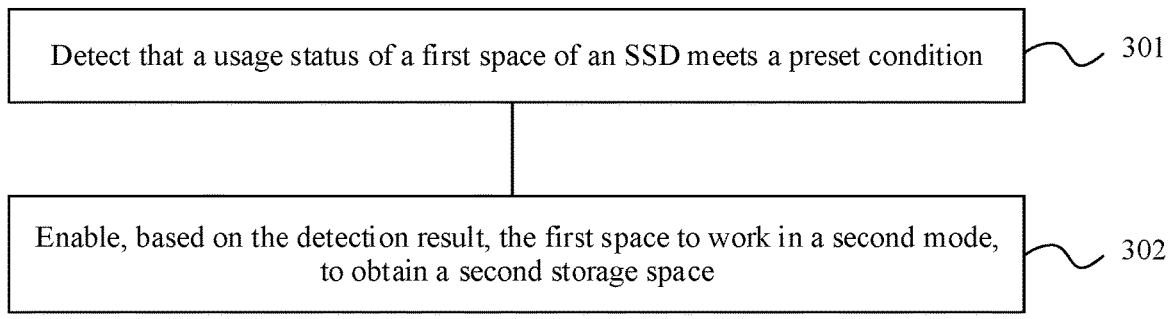
FIG. 3 is a schematic flowchart of an embodiment.

A schematic flowchart of an embodiment is shown in FIG. 3, and includes the following steps.

Step 301: Detect that a usage status of a first storage space of an SSD meets a preset condition.

The first storage space works in a first mode.

Optionally, the usage status is program/erase cycles, TBW, or an amount of written data, and the preset condition is a predetermined threshold.

The usage status is one of or a combination of the program/erase cycles, the TBW, or the amount of written data, or may be one that first meets the preset condition in the three.

Step 302: Enable, based on the detection result, the first storage space to work in a second mode to obtain a second storage space.

The first storage space works in the first mode, and after the first storage space works in the second mode, the first storage space is changed to the second storage space. Implementation of the foregoing is described in detail in the following embodiment.

A quantity of bits that can be stored in a cell in the first storage space is greater than a quantity of bits that can be stored in a cell in the second storage space.

In this embodiment, the first mode may be one of a QLC, a TLC, or an MLC. As technologies advance, the first mode may alternatively be a mode in which a cell is provided with a larger capacity. This is not limited in this embodiment of the present disclosure.

In an embodiment, when the first mode is the QLC, the second mode may be at least one of the TLC, the MLC, and an SLC.

In an embodiment, when the first mode is the TLC, the second mode may be at least one of the MLC and the SLC.

In an embodiment, when the first mode is the MLC, the second mode may be the SLC.

The lifespan of a cell with a larger capacity is shorter than a lifespan of a cell with a smaller capacity, but the cell with a larger capacity may be used as a cell with a smaller capacity. When the usage status of the first storage space of the SSD meets the preset condition, the first storage space that originally works in a mode of a cell with a larger capacity is enabled to work in a mode of a cell with a smaller capacity to obtain the second storage space. This prolongs the lifespan of the SSD. In addition, before the usage status of the first storage space meets the preset condition, the first storage space may provide a capacity in the first mode. After the first storage space works in the second mode, that is, after the first storage space works in the mode of a cell with a smaller capacity, the second storage space with a smaller capacity is obtained. While the lifespan of the SSD is prolonged, the additional second storage space can be provided. Therefore, while the lifespan of the SSD is prolonged, an additional storage capacity can be further provided.

During implementation of this embodiment, the preset condition may be set as a standard condition that the SSD promises to a user, for example, a specific lifespan, which may be represented as program/erase cycles, an amount of written data, or terabytes written. In this way, after the preset condition is met, the user may continue to use the storage space working in the second mode after using up a storage capacity of the SSD with the lifespan promised by the vendor. This prolongs the lifespan of the SSD and provides the additional storage space for the user.

The SSD provided in this embodiment may be used in a public cloud, for example, may provide storage resources for a virtual machine (VM) in the public cloud, or may be used in a cloud storage service. The public cloud is usually a cloud that is provided by a third-party provider and that can be used by the user.

In an embodiment, the first storage space may be storage spaces of the SSD, that is, all spaces of the SSD. In another embodiment, the first storage space may be one of a plurality of storage spaces of the SSD.

Figure 4:
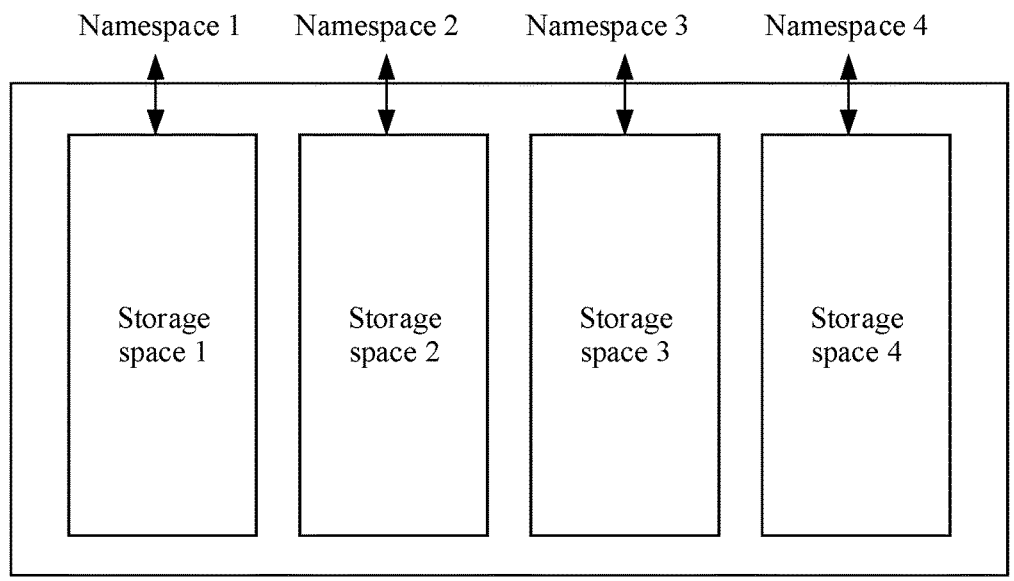
FIG. 4 is a schematic diagram of an SSD that supports a plurality of namespaces according to an embodiment.

As shown in FIG. 4, the SSD provided in this embodiment is an SSD that supports an NVMe protocol. The SSD may provide a plurality of namespaces, and a storage space corresponding to one namespace is the first storage space. Therefore, in this embodiment of the present invention, the SSD may be managed at a granularity of a storage space corresponding to a namespace according to the SSD management method provided in this embodiment of the present invention. In another implementation, the SSD provides only one namespace, and a storage space corresponding to the namespace is the first storage space.

Figure 5:
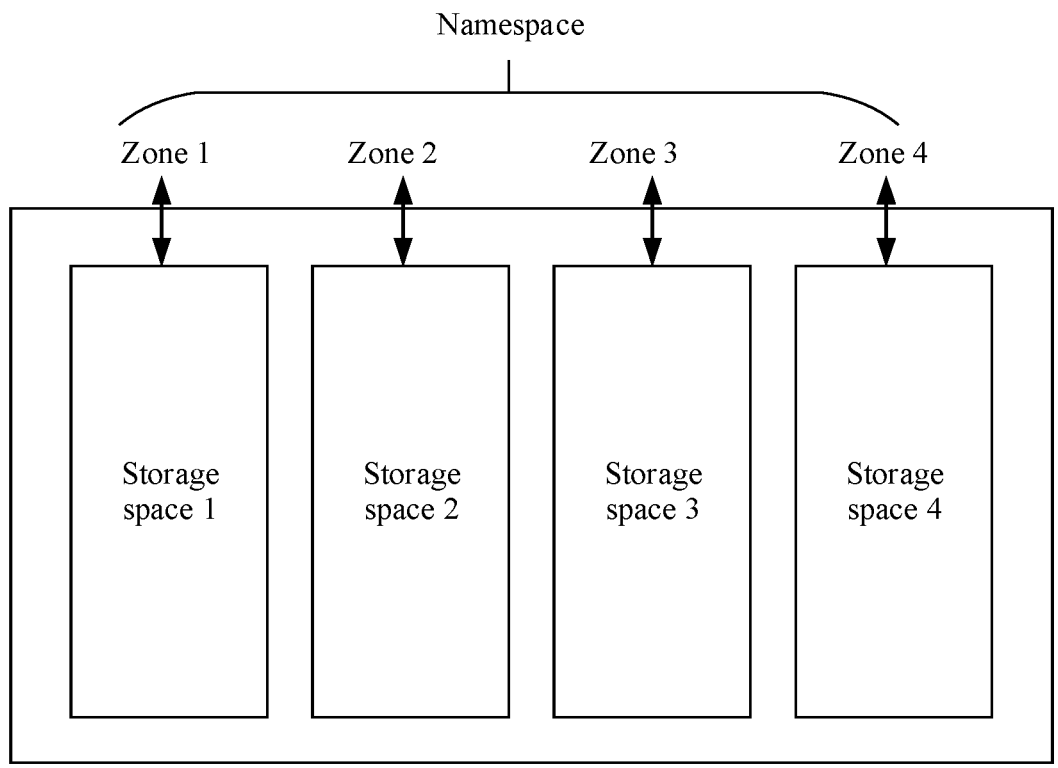
FIG. 5 is a schematic diagram of an SSD that supports a zoned namespace according to an embodiment.

As shown in FIG. 5, the SSD provided in this embodiment is an SSD that supports a zoned namespace (ZNS). One namespace is divided into a plurality of zones, and a storage space corresponding to one zone is the first storage space. Therefore, in this embodiment, the SSD may be managed at a granularity of a storage space corresponding to a zone according to the SSD management method provided in this embodiment.

Figure 6:
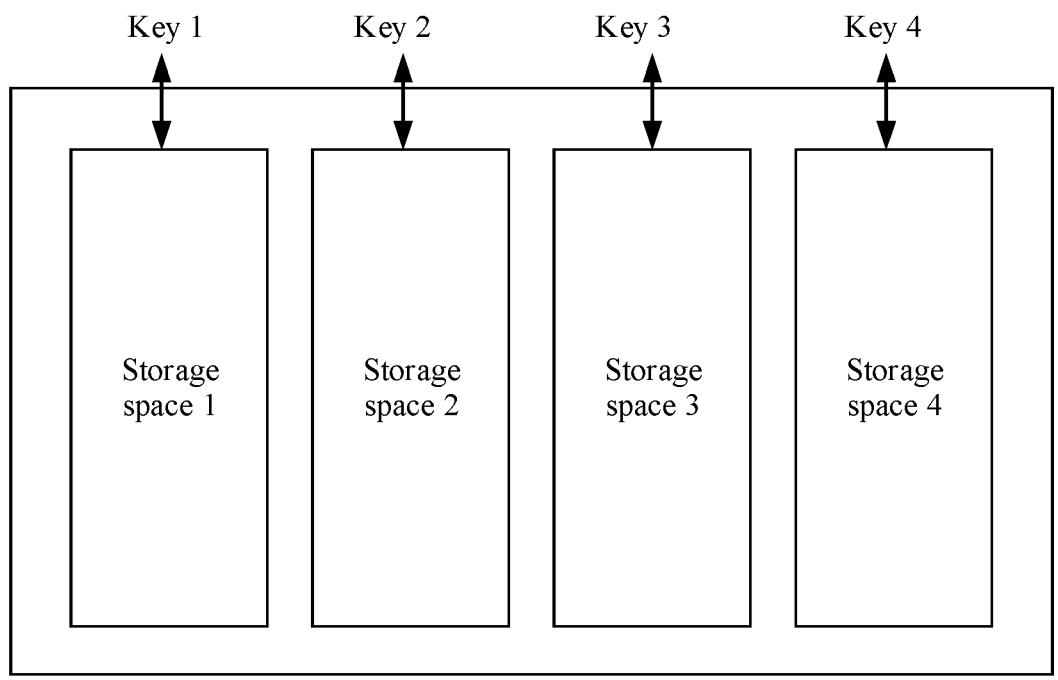
FIG. 6 is a schematic diagram of a key-value-based SSD according to an embodiment.

As shown in FIG. 6, the SSD provided in this embodiment is a key-value (KV)-based SSD, and a storage space corresponding to a key and that can be used to continuously store data is used as the first storage space. In this embodiment, the SSD may be managed at a granularity of a storage space used to continuously store data according to the SSD management method provided in this embodiment.

In this embodiment, a plurality of preset conditions may be set, for example, a first preset condition and a second preset condition. For example, the first storage space initially works in the QLC, and when the usage status meets the first preset condition, the first storage space is enabled to work in the TLC to obtain the second storage space. That is, when the first storage space works in the TLC, the second storage space is obtained due to a decreased capacity. When the usage status meets the second preset condition, and the second storage space is enabled to work in the MLC to obtain a third storage space. That is, when the second storage space works in the MLC, the third storage space is obtained due to a decreased capacity.

In another embodiment, the usage status is update frequency of data stored in the first storage space. When the update frequency meets a preset condition, the first storage space is enabled to work in the second mode. The second mode corresponds to the second storage space. Because a capacity of a cell corresponding to the first mode is greater than a capacity of a cell corresponding to the second mode, the second storage space with a smaller storage capacity is obtained after the first storage space works in the second mode. The preset condition is a predetermined threshold. In another embodiment, the usage status is a property of data stored in the first storage space. When the property of the stored data meets a preset condition, the first storage space is enabled to work in the second mode to obtain the second storage space. Because a capacity of a cell corresponding to the first mode is greater than a capacity of a cell corresponding to the second mode, the second storage space with a smaller storage capacity is obtained after the first storage space works in the second mode. The preset condition is one or more of metadata, parity data in erasure coding (EC), or parity data in a redundant array of independent disks (RAID). That is, when the property of the data stored in the first storage space is the metadata, the parity data in the EC, or the parity data in the RAID, the first storage space is enabled to work in the second mode to obtain the second storage space. Because the capacity of the cell corresponding to the first mode is greater than the capacity of the cell corresponding to the second mode, after the first storage space works in the second mode, the storage capacity is decreased to obtain the second storage space. Update frequency of the metadata, the parity data in the EC, or the parity data in the RAID is high. Storing data with high update frequency in the first storage space causes a high degree of wear of the first storage space. During specific implementation, the SSD includes a plurality of storage spaces, each storage space is configured to store data of one flow, and one of the storage spaces is the first storage space.

In another embodiment, the usage status is an error rate of data stored in the first storage space. When the error rate of the data stored in the first storage space meets a preset condition, the first storage space is enabled to work in the second mode.

In another embodiment, the usage status of the first storage space meets the preset condition, and the first storage space is enabled to work in the second mode, to obtain the second storage space. Because a capacity of a cell corresponding to the first mode is greater than a capacity of a cell corresponding to the second mode, after the first storage space works in the second mode, the second storage space with a smaller storage capacity is obtained. The second storage space may include a plurality of subspaces working in different modes. For example, the first storage space works in the QLC. When the usage status meets the preset condition, a part of the first storage space is enabled to work in the TLC to obtain a subspace 1, and another part is enabled to work in the MLC to obtain a storage subspace 2.

The first storage space initially works in the first mode. After the usage status of the first storage space meets the preset condition, the first storage space is enabled to work in the second mode, to obtain the second storage space. A quantity of bits stored in a cell in the first storage space is greater than a quantity of bits stored in a cell in the second storage space. Therefore, after the first storage space works in the second mode, the capacity is decreased to obtain the second storage space. For example, the first mode is the QLC, and the second mode is the TLC. One cell corresponds to one floating gate transistor, a floating gate transistor that supports the QLC can store 4-bit data, and a floating gate transistor that supports the TLC can support 3-bit data. Therefore, the first storage space works in the QLC, the usage status of the first storage space meets the preset condition, and the first storage space is enabled to work in the TLC. The first storage space works in the TLC, to obtain the second storage space. Because a capacity of the TLC is ¾ of a capacity of the QLC, the storage space is decreased, and the capacity of the second storage space is ¾ of the capacity of the first storage space.

In an embodiment, an example in which a capacity of the SSD is 1024 gigabytes (Gigabyte, GB) is used. The 1024 GB capacity is 1 trillion bytes (TB). A capacity of the SSD that is promised to the user is 1 TB, and the preset condition is program/erase cycles. The first storage space is of 1 TB, and the SSD works in the QLC in an initial state. That is, the first storage space works in the QLC. A first preset condition (that is, program/erase cycles promised to the user) is 300, a second preset condition is 1000, and a third preset condition is 3000 cycles. The first preset condition is the program/erase cycles promised to the user. According to the SSD management solution described in the foregoing embodiment, the storage space of the first storage space is 1 TB, and when the usage status of the first storage space meets the preset condition, that is, when program/erase cycles reach 300, the first storage space is enabled to work in the TLC, to obtain the second storage space. A capacity of the TLC is ¾ of a capacity of the QLC. Therefore, after the first storage space works in the TLC, the storage space is decreased, and the capacity of the second storage space is 1 TB (1024 GB)×¾=768 GB. When a usage status of the second storage space meets the second preset condition, that is, when program/erase cycles reach 1000, the second storage space is enabled to work in the MLC, to obtain a third storage space. A capacity of the MLC is ⅔ of the capacity of the TLC. Therefore, after the second storage space works in the MLC, the storage space is decreased, and a capacity of the third storage space is 768 GB×⅔=512 GB. When a usage status of the third storage space meets the preset condition, that is, when program/erase cycles reach 3000, the third storage space is enabled to work in the SLC to obtain a fourth storage space. A capacity of the SLC is ½ of the capacity of the MLC. Therefore, after the third storage space works in the SLC, the storage space is decreased, and a capacity of the fourth storage space is 512 GB×½=256 GB. Usually, program/erase cycles of the SLC are 10000. For details, refer to FIG. 7. In addition to program/erase cycles and storage spaces that are promised to the user, the SSD provided in this embodiment may further provide additional storage spaces and additional program/erase cycles. A capacity of the additional storage spaces is 768 GB+512 GB+256 GB=1024 GB, that is, 1 TB. The additional program/erase cycles are 1000+3000+10000=14000. Therefore, this embodiment of the present invention can provide the additional program/erase cycles, that is, prolong the lifespan of the SSD, and also provide the additional storage space. The foregoing embodiment is an example implementation and does not limit a selection sequence of the second mode in the present invention. For example, the first mode may be the QLC, and the second mode is the MLC; the first mode is the QLC, and the second mode is the SLC; or the first mode is the TLC, and the second mode is the MLC.

In this embodiment, during implementation of enabling the first storage space to work in the second mode, n lower bits in a quantity of bits that can be stored in a floating gate transistor in the first mode may be used as a quantity n of bits that can be stored in the floating gate transistor in the second mode. In this way, the first storage space is enabled to work in the second mode, to obtain the second storage space. That is, after the first storage works in the second mode, a quantity of bits stored in a cell in the first storage space is greater than a quantity of bits stored in a cell in the second storage space. Therefore, after the first storage works in the second mode, the capacity is decreased to obtain the second storage space. Herein, n is an integer greater than 0. According to a current technology, n may be 1, 2, or 3. This is not limited in this embodiment. During specific implementation, the SSD enables, by using firmware, the first storage space originally working in the first mode to work in the second mode, to obtain the second storage space, or this may be implemented by an SSD controller.

Figure 8:
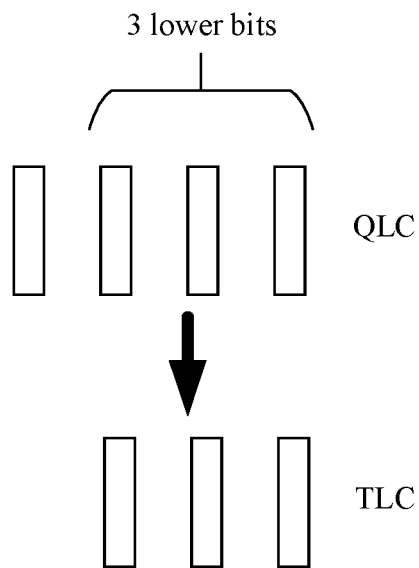
FIG. 8 is a schematic diagram of enabling a first storage space to work in a second mode according to an embodiment.

For example, the first mode is the QLC, and the floating gate transistor can store 4 bits in the QLC mode. The second mode is the TLC, and the floating gate transistor can store 3 bits in the TLC mode. In this scenario, the first storage space works in the second mode. As shown in FIG. 8, 3 lower bits in a quantity of bits that can be stored in the floating gate transistor in the QLC are used as a quantity of bits that can be stored in the floating gate transistor in the TLC. A program/erase cycle parameter and a read parameter may be set to control an operation on a corresponding bit in the floating gate transistor.

In this embodiment, the usage status of the first storage space meets the preset condition, and the first storage space is enabled to work in the second mode to obtain the second storage space. The first storage space works in the first mode before working in the second mode. A capacity of a cell corresponding to the first mode is greater than a capacity of a cell corresponding to the second mode. After the first storage space works in the second mode, the second storage space is obtained. That is, the second mode corresponds to the second storage space described in the foregoing embodiment. Therefore, the capacity of the second storage space is less than the capacity of the first storage space, and the SSD may set a corresponding mapping table for the first storage space. The mapping table provides a usage status, a preset condition, and a corresponding mode. The SSD implements the foregoing embodiments according to the mapping table. In another implementation, the SSD may provide a translation table to provide the usage status of the first storage space, the preset condition, and a corresponding mode translation relationship. A specific implementation is not specifically limited in this embodiment of the present invention.

Figure 9:
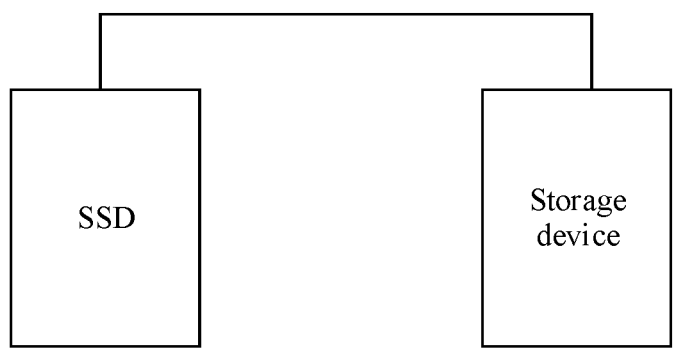
FIG. 9 is a schematic diagram of a data backup relationship of an SSD according to an embodiment.
Figure 10:
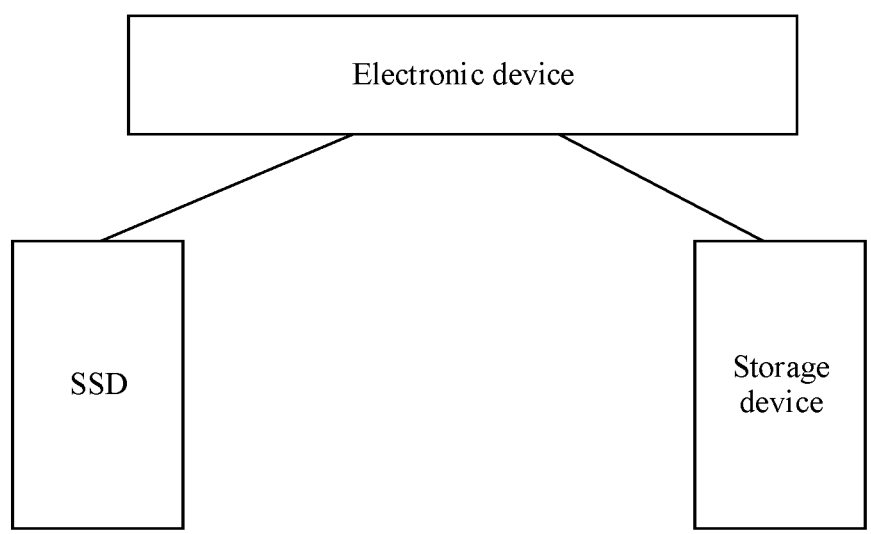
FIG. 10 is a schematic diagram of a data backup relationship of an SSD according to an embodiment.
Figure 11:
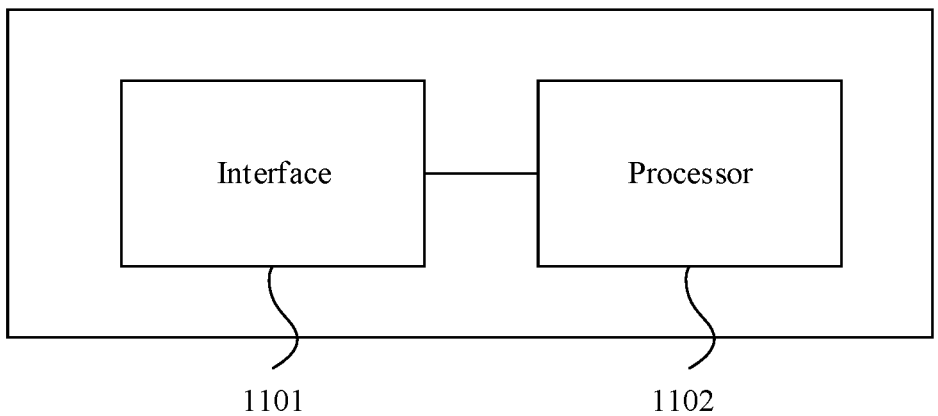
FIG. 11 is a schematic diagram of a structure of an electronic device according to an embodiment.

To prevent a data loss, the SSD management solution provides for backing up data in the first storage space before the first storage space is enabled to work in the second mode. In an implementation method, as shown in FIG. 9, the SSD performs the solution provided in this embodiment. Before enabling the first storage space to work in the second mode, the SSD backs up the data in the first storage space to a storage device. In a connection relationship shown in FIG. 9, the SSD may communicate with the storage device through a bus. In another implementation, if the SSD and the device each have a network interface, for example, an Ethernet interface, the SSD and the storage device may communicate with each other via a network, so that the data in the first storage space of the SSD is backed up to the storage device. In another implementation, as shown in FIG. 10, both the SSD and the storage device communicate with an electronic device, and the electronic device backs up the data in the first storage space of the SSD to the storage device. The electronic device may be a host, an array controller of a storage array, a storage node in a distributed storage system, a disk enclosure in a storage system, a server, a notebook computer, or the like. As shown in FIG. 11, the electronic device includes an interface 1101 and a processor 1102. The interface 1101 communicates with the processor 1102, and the processor 1102 is configured to implement a corresponding function of the electronic device. The interface 1101 may be a network interface controller, a host adapter, a bus-level interface, or the like. This is not limited in this embodiment. The bus-level interface may be a peripheral component interconnect express (PCIE) interface. The interface 1101 may alternatively be another interface configured to communicate with the SSD. The electronic device communicates with the SSD through the interface. The processor 1102 may be a central processing unit (CPU), a field programmable gate array (FPGA), or an application-specific integrated circuit (ASIC), or may be a combination thereof. This embodiment further provides, after the first storage space of the SSD works in the second mode to obtain the second storage space, the SSD reports the capacity of the second storage space to the electronic device. The storage device in FIG. 9 and FIG. 10 may be an SSD, a mechanical disk, or the like, or may be a storage system in communication with the electronic device that performs backup. In another implementation, the storage device in FIG. 9 and FIG. 10 may be a cloud storage system. The data in the first storage space of the SSD is backed up, to prevent a data loss in the first storage space when the first storage space is enabled to work in the second mode to obtain the second storage space. Further, in the systems shown in FIG. 9 and FIG. 10, only valid data stored in the first storage space of the SSD may be backed up, to reduce an amount of data that needs to be backed up, improve data backup efficiency, and save storage space. In this embodiment of the present invention, after the data or the valid data is backed up to the storage device, and the first storage space is enabled to work in the second mode to obtain the second storage space, the data or the valid data may be further migrated back from the storage device to the SSD, and may be specifically written in the second storage space.

The SSD management solution provided in the foregoing embodiment may be implemented by the SSD. With reference to the schematic diagram of the structure of the SSD shown in FIG. 1, the SSD management solution may be specifically implemented by a solid state drive controller. The solid state drive controller in this embodiment may be a CPU, an FPGA, or an ASIC, or may be a combination thereof.

Figure 12:
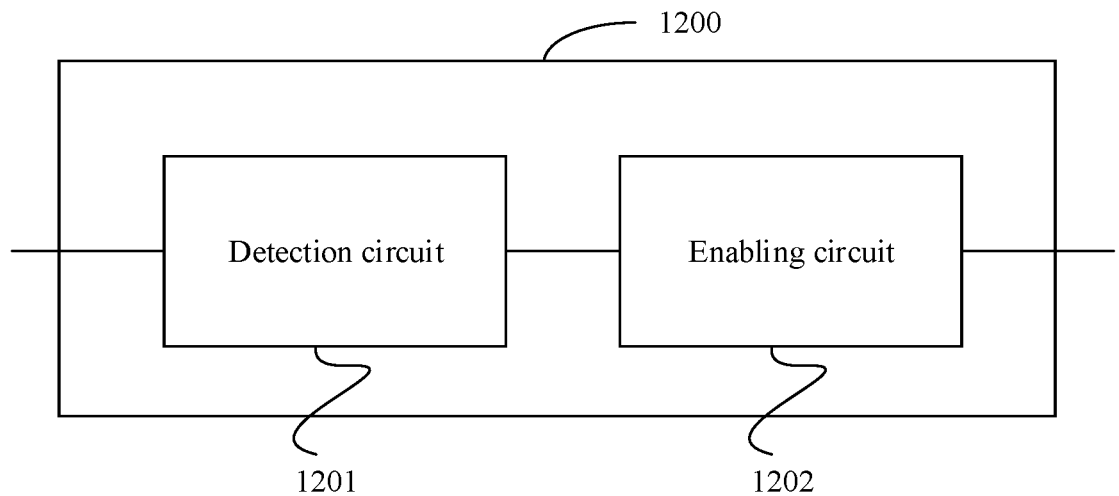
FIG. 12 is a schematic diagram of a structure of a solid state drive controller according to an embodiment.

As shown in FIG. 12, an embodiment provides a solid state drive controller 1200 including a detection circuit 1201 and an enabling circuit 1202. The detection circuit 1201 is configured to detect that a usage status of a first storage space of an SSD meets a preset condition. The enabling circuit 1202 is configured to enable the first storage space to work in a second mode to obtain a second storage space. Further, the solid state drive controller 1200 further includes a backup circuit, configured to back up data in the first storage space. In another implementation, the backup circuit is configured to back up valid data in the first storage space. The solid state drive controller 1200 may be configured to implement various functions provided by the SSD in embodiments.

Figure 13:
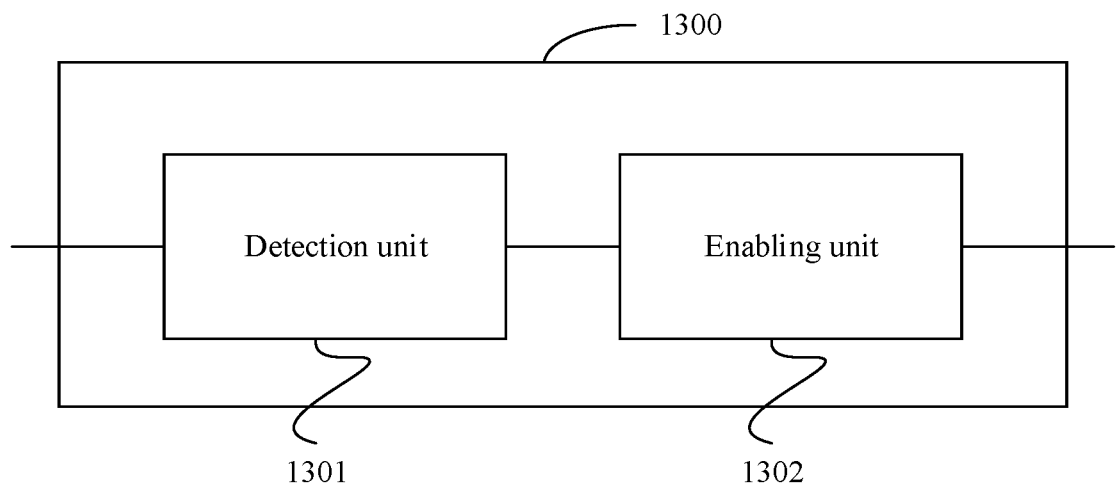
FIG. 13 is a schematic diagram of a structure of a solid state drive management apparatus according to an embodiment.

As shown in FIG. 13, a solid state drive management apparatus 1300 is provided and includes a detection unit 1301 and an enabling unit 1302. The detection unit 1301 is configured to detect that a usage status of a first storage space of an SSD meets a preset condition. The enabling unit 1302 is configured to enable the first storage space to work in a second mode to obtain a second storage space. Further, the solid state drive management apparatus 1300 includes a backup unit configured to back up data in the first storage space. In another implementation, the backup unit is configured to back up valid data in the first storage space. The solid state drive management apparatus 1300 provided in this embodiment may be implemented by hardware, or may be implemented by software, or may be implemented by a combination of software and hardware. The solid state drive management apparatus 1300 may be configured to implement various functions provided by the SSD in the disclosed embodiments.

Embodiments further provide a computer-readable storage medium that includes program instructions and a solid state drive controller that executes the program instructions to implement the SSD management solution. In a specific implementation, the computer program product may provide firmware of the SSD.

Embodiments further provide a computer program product. The computer program product includes program instructions and a solid state drive controller that executes the program instructions to implement the SSD management solution. During specific implementation, the computer program product may provide firmware of the SSD.

With reference to the connection relationship between the SSD and the electronic device shown in FIG. 10, in another embodiment, the electronic device detects that a usage status of a first storage space of the SSD meets a preset condition; and the electronic device instructs the SSD to enable the first storage space to work in a second mode, to obtain a second storage space. The electronic device detects that the usage status of the first storage space of the SSD meets the preset condition. The first storage space works in a first mode. The electronic device sends, based on the detection result, an instruction to the SSD, to enable the first storage space to work in the second mode to obtain the second storage space. A quantity of bits that can be stored in a cell in the first storage space is greater than a quantity of bits that can be stored in a cell in the second storage space. The SSD receives the instruction sent by the electronic device and enables, based on the instruction, the first storage space of the SSD working in the first mode to work in the second mode to obtain the second storage space. A quantity of bits that can be stored in a cell in the first storage space is greater than a quantity of bits that can be stored in a cell in the second storage space. In an implementation, the instruction sent by the electronic device to the SSD may include information about the second mode, for example, a cell type. A specific value in the instruction may represent the information about the second mode. In another implementation, the SSD stores mode translation information of the first storage space and the SSD sequentially performs mode translation based on an instruction sent by the electronic device. For example, the mode translation information includes a TLC, an MLC, and an SLC. Initially, the first storage space works in the TLC and the electronic device sends an instruction for the first time to enable the first storage space to work in the MLC to obtain the second storage space. The electronic device sends an instruction again to enable the second storage space to work in the SLC to obtain a third storage space.

In an implementation, prior to enabling the first storage space to work in the second mode based on the instruction, the electronic device or the SSD backs up data in the first storage space. Before the first storage space is enabled to work in the second mode, the data in the first storage space is backed up to prevent a data loss. During specific implementation, the data may be backed up to a cloud storage device or to another storage device.

In another implementation, prior to enabling the first storage space to work in the second mode based on the instruction, the electronic device or the SSD backs up valid data in the first storage space. Prior to enabling the first storage space to work in the second mode, the valid data in the first storage space is backed up. This prevents a data loss and reduces an amount of backup data. During specific implementation, the valid data may be backed up to a cloud storage device or another storage device.

The electronic device obtains the usage status of the first storage space of the SSD such as by monitoring the usage status of the first storage space of the SSD, or the SSD may report the usage status of the first storage space. After the first storage space of the SSD works in the second mode to obtain the second storage space, the SSD reports a storage capacity of the second storage space to the electronic device. For details about the usage status, refer to the description in the foregoing embodiment.

In this embodiment, the first storage space and the second storage space (collectively referred to as a "storage space") are physical spaces for storing data in the SSD. In an implementation, an actual storage capacity of the storage space is greater than an available storage capacity. That is, the storage space is equal to a sum of a storage space corresponding to the available storage capacity and over-provisioning (OP), and a capacity of the storage space is equal to a sum of the available storage capacity and a capacity of the over-provisioning. In another implementation, the storage space is a storage space corresponding to the available storage capacity. This is not limited in embodiments of the present invention.

It may be clearly understood by a person skilled in the art that, for the purpose of convenient and brief description, for a detailed working process of the foregoing system, apparatus, and unit, refer to a corresponding process in the foregoing method embodiment, and details are not described herein again.

In the several embodiments provided herein, it should be understood that the disclosed system, apparatus, and method may be implemented in other manners. For example, the described apparatus embodiment is merely an example. For example, division into the units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, in other words, may be located in one position, or may be distributed on a plurality of network units. Some or all of the units may be selected based on actual requirements to achieve the objectives of the solutions of embodiments.

In addition, functional units in embodiments may be integrated into one processing unit, or each of the units may exist alone physically, or two or more units may be integrated into one unit.

When the functions are implemented in a form of a software function unit and sold or used as an independent product, the functions may be stored in a computer-readable storage medium. Based on such an understanding, the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present disclosure. The foregoing storage medium includes any medium that can store program code, such as a USB flash drive, a removable hard disk, a read-only memory (ROM), a random access memory (RAM), a magnetic disk, or an optical disc.

What is claimed is:

1. A solid state drive (SSD) management method, comprising:
    detecting, by a controller, that a usage status of a first storage space of an SSD meets a preset condition, wherein the first storage space works in a first mode;
    initiating, by the controller, backing up of valid data in the first storage space following determination that the preset condition has been met; and
    following completion of data backup in the first storage space, enabling, by the controller based on the detection that the first storage space has met the preset condition, the first storage space to work in a second mode to obtain a second storage space, wherein a quantity of bits that can be stored in a cell in the second storage space is less than a quantity of bits that can be stored in a cell in the first storage space.

2. The method according to claim 1, wherein the usage status is program/erase cycles, terabytes written, or an amount of written data.

3. The method according to claim 1, wherein the first storage space comprises all operational storage spaces of the SSD.

4. The method according to claim 1, wherein the first storage space is one of a plurality of storage spaces of the SSD.

5. The method according to claim 1, wherein the first storage space is a storage space corresponding to a namespace of the SSD.

6. The method according to claim 1, wherein the first storage space is a storage space corresponding to one zone in a zoned namespace.

7. The method according to claim 1, wherein the first mode is a quad-level cell (QLC), and the second mode is at least one of a triple-level cell (TLC), a multi-level cell (MLC), and a single-level cell (SLC); or
    the first mode is a triple-level cell TLC, and the second mode is at least one of a multi-level cell MLC and a single-level cell SLC; or
    the first mode is a multi-level cell MLC, and the second mode is a single-level cell SLC.

8. The method according to claim 1, wherein the SSD is incorporated into a public cloud storage.

9. A solid state drive (SSD), comprising:
    a storage medium comprising a first storage space; and
    a solid state drive controller, the solid state drive controller being configured to:
        detect that a usage status of the first storage space meets a preset condition, wherein the first storage space works in a first mode;
        initiate backing up of valid data in the first storage space following determination that the preset condition has been met; and
        following completion of data backup in the first storage space, enable, based on the detection that the first storage space has met the preset condition, the first storage space to work in a second mode to obtain a second storage space, wherein a quantity of bits that can be stored in a cell in the second storage space is less than a quantity of bits that can be stored in a cell in the first storage space.

10. The SSD according to claim 9, wherein the usage status is one of program/erase cycles, terabytes written, an amount of written data, update frequency of stored data, or a property of stored data.

11. The SSD according to claim 9, wherein the first storage space comprises all operational storage spaces of the SSD.

12. The SSD according to claim 9, wherein the first storage space is one of a plurality of storage spaces of the SSD.

13. The SSD according to claim 9, wherein the first storage space is a storage space corresponding to a namespace of the SSD.

14. The SSD according to claim 9, wherein the first storage space is a storage space corresponding to one zone in a zoned namespace.

15. The SSD according to claim 9, wherein the first mode is a quad-level cell (QLC), and the second mode is at least one of a triple-level cell (TLC), a multi-level cell (MLC), and a single-level cell (SLC).

16. The SSD according to claim 9, wherein the first mode is a triple-level cell (TLC), and the second mode is at least one of a multi-level cell (MLC) and a single-level cell (SLC).

17. The SSD according to claim 9, wherein the first mode is a multi-level cell (MLC), and the second mode is a single-level cell (SLC).

18. The SSD according to claim 9, wherein the SSD is incorporated into a public cloud storage.

19. A solid state drive controller, comprising:
    a detection circuit;
    a backup circuit; and
    an enabling circuit;
        the detection circuit being configured to detect that a usage status of a first storage space of a solid state drive SSD meets a preset condition, the first storage space working in a first mode;
        the backup circuit being configured to initiate a backup of valid data in the first storage space following determination that the preset condition has been met; and
        the enabling circuit being configured to enable, based on the detection result, the first storage space to work in a second mode to obtain a second storage space, wherein a quantity of bits that can be stored in a cell in the second storage space is less than a quantity of bits that can be stored in a cell in the first storage space.

20. The solid state drive controller according to claim 19, wherein the usage status is one of program/erase cycles, terabytes written, an amount of written data, update frequency of stored data, or a property of stored data.

21. The solid state drive controller according to claim 19, wherein the first storage space is all operational storage spaces of the SSD.

22. The solid state drive controller according to claim 19, wherein the first storage space is one of a plurality of storage spaces of the SSD.

23. The solid state drive controller according to claim 19, wherein the first storage space is a storage space corresponding to a namespace of the SSD.

24. The solid state drive controller according to claim 19, wherein the first storage space is a storage space corresponding to one zone in a zoned namespace.

25. The solid state drive controller according to claim 19, wherein:
- the first mode is a quad-level cell (QLC), and the second mode is at least one of a triple-level cell (TLC), a multi-level cell (MLC), and a single-level cell (SLC); or
- the first mode is a triple-level cell (TLC), and the second mode is at least one of a multi-level cell (MLC) and a single-level cell (SLC); or
- the first mode is a multi-level cell (MLC), and the second mode is a single-level cell (SLC).

\* \* \* \* \*